United States Patent [19]

Kitaura et al.

[11] Patent Number: 4,956,132
[45] Date of Patent: Sep. 11, 1990

[54] METHOD FOR APPLYING MOLD-RELEASING AGENT ONTO MOLD SURFACES USING A MOLD-RELEASING SHEET

[75] Inventors: Toshihiko Kitaura; Akio Nakamura; Masayuki Sakamoto; Kouichi Takashima; Kiyotaka Hirakawa; Matao Mizota, all of Saga, Japan

[73] Assignee: Nitto Denko Corporation, Osaka, Japan

[21] Appl. No.: 268,674

[22] Filed: Nov. 7, 1988

Related U.S. Application Data

[62] Division of Ser. No. 137,282, Dec. 23, 1987, abandoned.

[30] Foreign Application Priority Data

Dec. 23, 1986 [JP] Japan .................. 61-313560
Mar. 16, 1987 [JP] Japan .................. 62-61478
Jul. 24, 1987 [JP] Japan .................. 62-186374

[51] Int. Cl.$^5$ ............................. B29C 33/68
[52] U.S. Cl. ....................... 264/39; 264/300; 264/325; 427/133
[58] Field of Search ............ 427/135, 133; 264/39, 264/300, 325

[56] References Cited

U.S. PATENT DOCUMENTS

| | | | |
|---|---|---|---|
| 1,813,235 | 7/1931 | Dunbar | 264/325 X |
| 2,310,619 | 2/1943 | Dillehay et al. | |
| 3,476,599 | 11/1969 | Grover et al. | |
| 3,525,783 | 8/1970 | Prikkel | |
| 3,644,247 | 2/1972 | Grunther et al. | 524/322 |
| 3,928,270 | 12/1975 | South, Jr. | 524/322 |
| 4,160,751 | 7/1979 | Bork et al. | 524/322 |
| 4,222,915 | 9/1980 | Wolff et al. | 524/322 |
| 4,370,448 | 1/1983 | Leland | |
| 4,459,380 | 7/1984 | Vostovich | 524/106 |
| 4,670,329 | 6/1987 | Pas | 264/39 X |

FOREIGN PATENT DOCUMENTS

| | | |
|---|---|---|
| 1479315 | 5/1969 | European Pat. Off. |
| 2034320 | 1/1972 | European Pat. Off. |
| 0188219 | 1/1986 | European Pat. Off. |
| 8404530 | 11/1984 | PCT Int'l Appl. |
| 975731 | 11/1982 | U.S.S.R. ............... 524/322 |

OTHER PUBLICATIONS

International Polymer Science and Technology, vol. 12, No. 12, 1985, pp. T/33–T/37.
Japanese Patent Gazette, Section CH, Week 8824, Class A, No. 88-165839(24).
European Search Report, EP No. 87 11 9049.
Patent Abstract of Japan, vol. 9, No. 215 (M–409) (1938), Sep. 3, 1985.

Primary Examiner—Jan H. Silbaugh
Assistant Examiner—Christopher A. Fiorilla
Attorney, Agent, or Firm—Sughrue, Mion, Zinn, Macpeak & Seas

[57] ABSTRACT

A method of applying a mold-releasing agent to the molding surfaces of a mold after cleaning the surface. This method involves inserting a mold-releasing sheet between said molding surfaces of a mold coating the molding surfaces with the mold releasing agent by heating and pressing the mold-releasing sheet to cure it, and removing the cured sheet from the molding surfaces of the mold. This mold-releasing sheet is composed of (i) uncured rubber, (ii) a curing agent, and (iii) a mold releasing agent. The uncured rubber can be selected from a group consisting of chloroprene rubber, butadiene rubber, nitrile rubber, ethylene-propylene terpolymer rubber, styrene-butadiene rubber, polyisoprene rubber, butyl rubber, silicone rubber, and fluoridated rubber.

1 Claim, 1 Drawing Sheet

METHOD FOR APPLYING MOLD-RELEASING AGENT ONTO MOLD SURFACES USING A MOLD-RELEASING SHEET

This is a division of application Ser. No. 07/137,282, filed Dec. 23, 1987, now abandoned.

FIELD OF THE INVENTION

This invention relates to a mold-releasing sheet which is used for smoothly releasing a molded article from a mold for a thermoplastic resin moldable material and also to a method for applying a mold-releasing agent to the molding surface of a mold using the mold-releasing sheet.

More particularly, the invention relates to a sheet for efficiently applying a mold-releasing agent onto the surface of a mold from which a mold-releasing agent is removed by cleaning after molding step in a step for continuously producing semiconductor devices by continuously encapsulating semiconductor elements with an epoxy resin composition, etc., by transfer molding, and also to a method for applying a mold-releasing agent to the surface of the mold using the sheet.

BACKGROUND OF THE INVENTION

Semiconductor elements such as transistors, IC, LSI, etc., are usually resin-encapsulated by plastic package. Such a resin encapsulation is performed using a thermosetting resin moldable material such as an epoxy resin composition, etc., by casting, compression molding, injection molding, transfer molding, etc., in particular, by transfer molding which is excellent in mass producibility and workability.

In such molding, a mold-releasing agent contained in the thermosetting resin moldable material oozes onto the surface of a cavity which is the molding space of a mold to show mold-releasing action. However, when such molding is repeated many times, inconveniences occur such that the releasing property of moldings is greatly reduced and the phenomena such as roughness, etc., occur on the surface of moldings to give no luster on the surface of moldings. The reasons are considered to be caused by that the mold-releasing agent containing in the above-described molding material is successively accumulated on the surface of the cavity of the mold by repeated molding and gradually oxidized and deteriorated to form a hard oxidized and deteriorated mold-releasing agent layer. That is, since the oxidized and deteriorated mold-releasing agent layer has neither smooth surface nor mold-releasing function, the above-described problems occur.

Accordingly, it has hitherto been performed the following method. That is, a melamin resin moldable material different from the above-described epoxy resin moldable material is placed in the cavity followed by molding to cure by heating, whereby the oxidized and deteriorated mold-releasing agent layer is attached to the hardened product in unitary body, and the hardened product is removed in its state from the cavity of the mold, whereby the surface of the cavity is cleaned.

However, in such a case, it is necessary to fill the melamin resin moldable material in many cavities of a mold and also withdraw the hardened product therefrom, the work being very troublesome as well as there is a problem that the working environment is greatly reduced by the odor emitted from the melamin resin moldable material at molding.

Thus, the inventors previously developed a sheet-form mold-cleaning composition comprising an uncured rubber composition containing therein a glycol ether (Japanese Patent Application No. 252536/86). The cleaning of mold by the sheet-form mold-releasing composition is performed by inserting the sheet-form composition between upper and lower molds, contacting the portion of the sheet corresponding to the surface of each cavity of the mold by the pressure at closing the mold, curing the composition by heating in its state to convert the whole uncured rubber composition into cured rubber, whereby the oxidized and deteriorated mold-releasing agent layer on the surface of each cavity is united with the cured rubber in unitary body, and then removing the sheet-form cured rubber from the mold to clean the surface of the cavities. By using such a mold-cleaning composition, the problem in the case of using the above-described thermosetting melamine resin moldable material does not occur. Also, the cavity surface of mold is cleaned to the initial mirror-surface state as the case of using the melamin resin moldable material.

However, in the case of cleaning the surface of cavities, etc., using the above-described mold-cleaning composition or the thermosetting melamin resin moldable material, the surface of mold, such as the cavity surface, etc., is cleaned to mirror-surface state and no mold-releasing agent exists on the surface of the mold. If the mold surface is completely cleaned, in the case of molding directly after cleaning, the molded article attached to the surface of the mold and cannot be smoothly released from the mold. This is because when the mold surface is completely cleaned, insufficient mold-releasing agent oozes from a moldable material in a single molding to sufficiently coat the surface of the mold.

Therefore, it has been proposed to spray a mold-releasing agent onto the surface of the mold after cleaning and has been practically performed. However, although mold-releasing property may be provided to the mold surface, in the case of employing the above-described method, problems occur such that a difference in concentration of mold-releasing agent occurs on the surface of the mold, as the case may be, the mold-releasing agent attaches to the surface of the molded article to reduce the appearance of the product, the mold-releasing agent also attaches to other portions of the mold than the molding surfaces at spraying to greatly reduce the molding condition, and further sucking of the sprayed mold-releasing agent injures the workers' health.

According, in practical operation, after cleaning a mold surface, an epoxy resin moldable material is molded to an extent of 5 shots (the molding is called "dummy molding") for sufficiently attaching the mold-releasing agent contained in the moldable material to the surface of the mold, and thereafter, conventional molding is carried out. However, it is very uneconomical to perform about 5 shots of such dummy molding, which causes the reduction of molding efficiency.

SUMMARY OF THE INVENTION

The present invention has been made under such circumstances and the object of this invention is to provide a mold-releasing sheet capable of easily performing the uniform application of a mold-releasing agent to the surface of a mold after cleaning without involving the reduction of molding conditions, etc., and the reduction of working environment, etc.

Another object of this invention is to provide a method of applying a mold-releasing agent to the surface of mold after cleaning using the mold-releasing sheet.

Those objects can be attained by the invention as set forth hereinbelow.

The mold-releasing sheet of this invention comprises an uncured rubber composition comprising an uncured rubber and a curing agent as a base material and a mold-releasing agent contained in the base material.

DETAILED DESCRIPTION OF THE INVENTION

Figure 1:
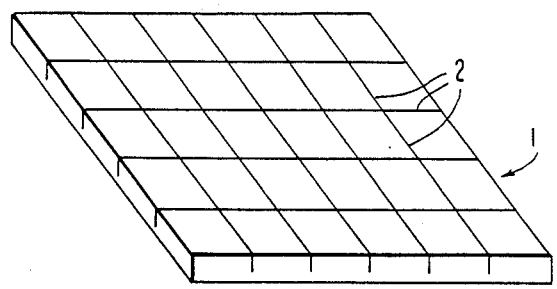
FIG. 1 is a slant view showing an example of the mold-releasing sheet of this invention and FIG. 2 to FIG. 4 are cross sectional views showing the cleaning step for mold surfaces using the mold-releasing sheet of this invention.

Then, the invention is explained below in detail.

The mold-releasing sheet of this invention comprises the uncured rubber composition containing therein a mold-releasing agent as described above. Thus, when the sheet is inserted between upper and lower molds the molding surfaces of which are cleaned and in mirror-surface state followed by heating to cure the composition, the mold-releasing agent in the uncured rubber composition oozes and attaches to the surfaces of the mold to form uniform mold-releasing agent layer on the surfaces of the mold. That is, by a simple operation of inserting the sheet between molds, molding once under heating, and then removing the cured sheet from the mold, a uniform layer of mold-releasing agent can be formed on the cleaned and mirror-like surfaces of the mold. Accordingly, in the case of using the mold-releasing sheet of this invention, the troubles such as ununiform application of mold-releasing agent, reduction of molding conditions and working environment, etc., as in the case of above-described spray coating do not occur. Furthermore, since the above-described operation is very convenient and simple, the working efficiency of applying mold-releasing agent to mold can be greatly improved.

The mold-releasing sheet of this invention is obtained by incorporating a mold-releasing agent in an uncured rubber composition as a base material. That is, after mixing both components by a known manner, the mixture is fabricated into a sheet form.

The uncured rubber constituting the uncured rubber composition for use in this invention is mainly composed of natural rubber (NR), chloroprene rubber (CR), butadiene rubber (BR), nitrile rubber (NBR), ethylene-propylene terpolymer rubber (EPT), ethylene-propylene rubber (EPM), styrene-butadiene rubber (SBR), polyisoprene rubber (IR), butyl rubber (IIR), silicone rubber (Q), fluorinated rubber (FKM), etc., singly or as a mixture thereof.

The uncured rubber becomes cured rubber by being cured in a mold. In the above-described uncured rubbers, EPT, SBR, NBR, or a mixture thereof is preferred in this invention.

EPT is a cyclic or acyclic copolymer having ethylene, α-olefin, and non-conjugated double bond.

Then, EPT is explained in detail. EPT is a terpolymer composed of ethylene, an α-olefin (particularly, propylene), and a polyene monomer as illustrated below. Examples of the polyene monomer are dicyclopentadiene, 1,5-cyclooctadiene, 1,1-cyclooctadiene, 1,6-cyclododecadiene, 1,7-cyclododecadiene, 1,5,9-cyclododecatriene, 1,4-cycloheptadiene, 1,4-cyclohexadiene, norbornadiene, methylene-norbornene, 2-methylpentadiene-1,4, 1,5-hexadiene, 1,6-heptadiene, methyltetrahydroindene, 1,4-hexadiene, etc.

The copolymerization ratio in the above-described terpolymer is preferably from 30 to 80 mol % ethylene, from 0.1 to 20 mol % polyene, and rest being α-olefin. The terpolymer containing from 30 to 60 mol % ethylene is more preferred. Also, the terpolymer having Mooney viscosity $ML_{1+4}$ (100° C.) of from 20 to 70 is preferred. Specific examples of the above-described EPT are Mitsui EPT 4021, Mitsui EPT 4045, and Mitsui EPT 4070 (trade names, made by Mitsui Petrochemical Industries, Ltd.).

Also, SBR having a styrene content of from 15 to 30 mol % and a Mooney viscosity $ML_{1+4}$ (100° C.) of from 20 to 80, preferably from 35 to 60, is suitably used in this invention. Specific examples of such SBR are JSR-1502, JSR-1507, and JSR-1778 (trade names, made by Japan Synthetic Rubber Co., Ltd.).

NBR having an acrylonitrile content of from 20 to 60 mol %, preferably from 25 to 45 mol %, and a Mooney viscosity $ML_{1+4}$ (100° C.) of from 20 to 85, preferably from 30 to 70, is suitably used in this invention. Specific examples of such NBR are N-234L, N-230S, and N-230SH (trade names, made by Japan Synthetic Rubber Co., Ltd.).

The curing agent for use in this invention is, for example, an organic peroxide such as ketone peroxide, peroxy ketal, hydroperoxide, dialkyl peroxide, diacyl peroxide, peroxy ester or peroxy dicarbonate.

The amount of such a curing agent is usually from 1 to 10 parts by weight, preferably from 1.5 to 6 parts by weight, per 100 parts by weight of the uncured rubber.

In this invention, the curing agent containing, in particular, a peroxyketal represented by formula (1)

wherein $R_1$, $R_2$, $R_3$, and $R_4$, which may be the same or different, each represents a hydrogen atom or a monovalent hydrocarbon group.

By using such a curing agent, the curing rate for the uncured rubber can be accelerated, whereby cleaning of a mold can be performed in a short period of time.

Examples of the peroxyketal shown by formula (1) described above are 1,1-bis(t-butylperoxy)-3,3,5-trimethylcyclohexane, 1,1-bis(t-butylperoxy)cyclohexane, 2,2-bis(t-butylperoxy)octane, n-butyl-4,4-bis(t-butylperoxy)valerate, 2,2-bis(t-butylperoxy)butane, etc.

The amount of the peroxyketal is usually from 1 to 10 parts by weight, preferably from 1.5 to 6 parts by weight, per 100 parts by weight of the uncured rubber.

The above-described peroxyketal may be used as it is or as a mixture with an organic solvent such as dimethyl phthalate, dimethylformamide, toluene, xylene, dioctyl phthalate, methyl ethyl ketone, etc., for improving the dispersibility thereof in the uncured rubber. In this case, the amount of the organic solvent is generally 50 parts by weight or less, and most generally 20 parts by weight or less, per 100 parts by weight of the peroxyketal.

In this invention, a mold-releasing agent is used and examples of the mold-releasing agent are long chain fatty acids such as stearic acid, behenic acid, etc.; metal salts of long chain fatty acid, such as zinc stearate, calcium stearate, etc.; esteric waxes such as carnauba wax, montan wax, partially saponified ester of montanic acid, etc; long chain fatty acid amides such as stearylethylenediamide, etc.; paraffins such as polyethylene wax, etc.

The mold-releasing agent is usually compound in an amofunt of from 5% to 40% by weight, preferably from 10% to 30%, based on the weight of the whole composition. Also, the mold-releasing agent having a melting point of 200° C. or less and a boiling point of 200° C. or more is preferred in this invention. More preferred mold-releasing agent has a melting point of from 50° to 150° C. This is because molding by a mold is usually performed at temperature of from 150° C. to 200° C. and hence if the melting point of mold-releasing agent is higher than 200° C., the mold-releasing agent does not ooze onto the surface of mold, while if the boiling point is lower than 200° C., the mold-releasing agent may ooze onto the surface of mold but is evaporated away, whereby the mold-releasing agent tends to give no function.

In addition, the mold-releasing sheet of this invention can further contain an inorganic reinforcing agent (filler) such as silica, alumina, calcium carbonate, aluminum hydroxide, titanium oxide, etc. In this case, the amount of the reinforcing agent is suitably selected in the range of from 10 to 80 parts by weight per 100 parts of the uncured rubber.

In this invention, if necessary, at least one of imidazoles and imidazolines can be used as a removal aid.

As the imidazoles, an imidazole represented by formula (2) can be used with good results;

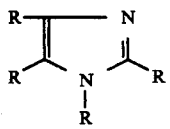
(2)

wherein R represents a hydrogen atom or a hydrocarbon group having less than 11 carbon atoms, which may have a substituent, and said Rs may be the same or different.

Typical examples of the imidazole are 2-methylimidazole, 2-ethyl-4-methylimidazole, 2-phenylimidazole, 1-benzyl-2-methylimidazole, 2,4-diamino-6[2'-methylimidazolyl-(1)']ethyl-s-triazine, 2,4-diamino-6[2'-ethyl-4'-methylimidazolyl-(1)']ethyl-s-triazine, etc.

Also, as the imidazolines, an imidazoline represented by following formula (3) can be used with good results;

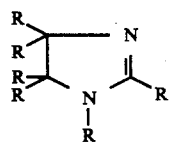
(3)

wherein R represents a hydrogen atom or a hydrocarbon group having less than 11 carbon atoms, which may have a substituent, and said Rs may be the same or different.

Typical examples of such an imidazoline are 2-methylimidazoline, 2-methyl-4-ethylimidazoline, 2-phenylimidazoline, 1-benzyl-2-methylimidazoline, 2-phenyl-4-methyl-5-hydroxymethylimidazoline, 2,4,-diamino-6[2'-methylimidazolyl-(1)']ethyl-s-triazine, 2,4-diamino-6[2'-methyl-4'-ethylimidazolyl-(1)']ethyl-s-triazine, 1-cyanoethyl-2-methylimidazoline, 1-cyanoethyl-2-methyl-4-ethylimidazoline, etc.

The removal aid can be used in an amount of usually less than 5% by weight, and preferably less than 4% by weight, based on the total weight of the whole composition.

The removal aid can be used as it is or as a mixture with water, an alcohol such as methanol, ethanol, n-propanol, etc., or an organic solvent such as toluene, xylene, etc., for improving the dispersibility thereof in the composition. In the case of using the removal aid with an organic solvent, etc., the amount of the organic solvent, etc., is usually 50 parts by weight or less, and most generally 20 parts by weight or less, per 100 parts by weight of the removal aid.

By using such a removal aid, the occurrence of a formalin-like odor and an amine-like odor can be prevented and hence no problem of reducing the working environment occurs.

The mold-releasing sheet of this invention is usually prepared by kneading the above described components by a kneading roll, etc., at temperature of from 70° to 150° C. and fabricating the kneaded mixture into a sheet having a definite thickness using a rolling roll, etc. The thickness of the mold-releasing sheet is usually from 2 to 10 mm, and preferably from 3 to 7 mm.

On the surface of the mold-releasing sheet may form cutting marks at a definite intervals for cutting the sheet into pieces of definite size. By forming such cutting marks, the mold-releasing sheet can be easily cut at the mark, whereby the sheet can be accurately and simply cut as compared to the case of cutting it by eyemeasure.

There is not particular restriction on the form of the cutting marks if the cutting marks have the above-described function but cutting mark 2 can be formed by forming cut in the sheet 1 as shown in FIG. 1. Also, marks are formed by printing and the sheet may be cut along the marks by means of a knife, etc.

The form of the cutting marks is not only squares as shown in FIG. 1 but also may be parallel lines in a definite direction, or marks in the peripheral portion only of the sheet with a definite interval. In addition, when the cutting marks are formed with a definite interval, the cutting marks function as a measure.

By inserting the mold-releasing sheet of this invention between the molding surfaces of a mold followed by heating and pressing to cure the sheet and removing the cured sheet from the mold, the mold-releasing agent can be uniformly attached to the surfaces of the mold.

Then, the method of using the mold-releasing sheet of this invention is explained in detail based on the accompanying drawings.

Figure 2:
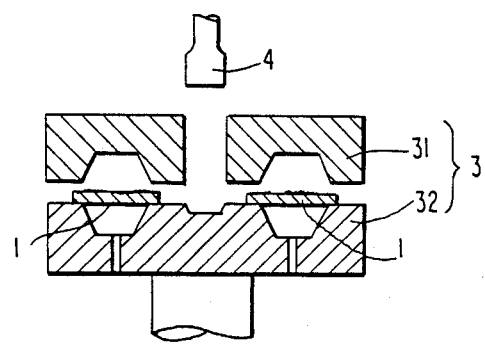
Figure 3:
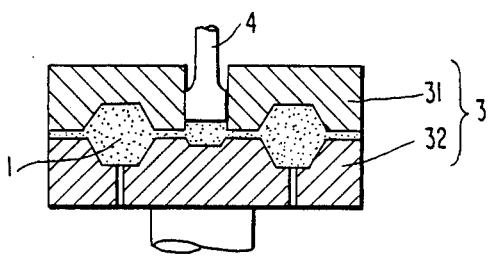
Figure 4:
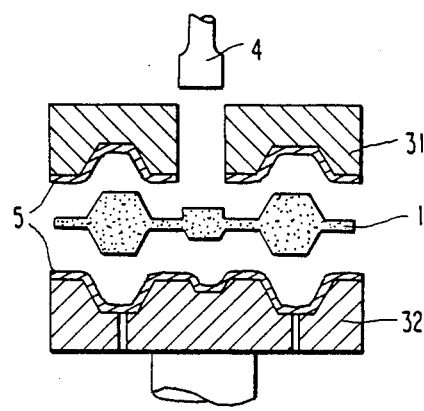

As shown in FIG. 2, the mold-releasing sheets 1 cut into sizes fitting to the size of a mold 3 are inserted between upper molds 31 and lower mold 32 of the mold 3. Then, the mold is closed with a gap of from 1 to 3 mm as shown in FIG. 3 and the sheets are cured for from 5 minutes to 10 minutes at temperature of from 160° C. to 200° C. while pressing by a plunger 4. After curing, the mold 3 and the plunger 4 are opened as shown in FIG. 4 and the cured sheet is removed from the mold, whereby the mold-releasing agent layer 5 is attached to the molding surface of the mold 3.

As described above, since the mold-releasing sheet of this invention has the above-described constitution, a mold-releasing agent can be uniformly applied to the molding surfaces of a mold by simply inserting the sheet between the molding surfaces of the mold and after curing the sheet by heating, removing the cured sheet from the mold. Accordingly, by using the mold-releasing sheet, it is unnecessary to practice dummy molding of about 5 shots after cleaning mold, which is very economical. Also, as compared to the case of coating a mold-releasing agent using spray, the invention has the advantages that not only a mold-releasing agent can be easily applied to the cleaned molding surfaces of a mold but also the reduction in molding condition and working environment does not occur and also the uniform application of mold-releasing agent can be realized.

Then, the invention is explained practically by referring to the following examples and comparison example.

EXAMPLE 1

A mixture of 100 parts of ethylene-propylene terpolymer rubber (EPT), Mitsui EPT 4045 (trade name, made by Mitsui Petrochemical Industries, Ltd.), 20 parts of silica powder, 5 parts of titanium oxide, 4 parts of an organic peroxide, and 20 parts of carnauba wax was formed into a sheet of 7 mm in thickness using a rolling roll to provide a desired mold-releasing sheet.

EXAMPLE 2

By following the same procedure as in Example 1 except that the amount of carnauba wax was reduced to 15 parts, a mold-releasing sheet was obtained.

EXAMPLE 3

By following the same procedure as in Example 1 except that the amount of carnauba wax was increased to 50 parts, a mold-releasing sheet was obtained.

EXAMPLE 4

By following the same procedure as in Example 1 except that zinc stearate, Zinc Stearate D (trade name made by Nippon Oil and Fats Co., Ltd.), was used in place of carnauba wax, a mold-releasing sheet was obtained.

EXAMPLE 5

By following the same procedure as in Example 1 using 100 parts of styrene butadiene rubber (SBR), JSR-1502 (trade name, made by Japan Synthetic Rubber Co., Ltd.), 20 parts of silica powder, 15 parts of aluminum hydroxide, 4 parts of an organic peroxide, and 20 parts of carnauba wax, a mold-releasing sheet was obtained.

EXAMPLE 6

By following the same procedure as in Example 1 using 100 parts of nitrile rubber (NBR), N-230SH (trade name, made by Japan Synthetic Rubber Co., Ltd.), 20 parts of silica powder, 5 parts of titanium oxide, 4 parts of an organic peroxide, and 20 parts of carnauba wax, a mold-releasing sheet was obtained.

EXAMPLE 7

By following the same procedure as in Example 1 except that carnauba wax was used together with zinc stearate (10:10) as used in Example 1, a mold-releasing sheet was obtained.

COMPARISON EXAMPLE 1

An epoxy resin molding material, MP-10 (trade name, made by Nitto Electric Industrial Co., Ltd.), was used as a thermosetting resin for dummy shot.

Each of the mold-releasing sheets obtained in the above-described examples was inserted between the molding surfaces of a mold for molding a thermosetting resin after finishing cleaning of the mold, and cured for 4 minutes at 175° C. The mold was opened immediately after curing, and the cured sheet was removed from the mold.

Thereafter, an epoxy resin moldable material, MP-10 (trade name, made by Nitto Electric Industrial Co., Ltd.) as a thermosetting resin moldable material was molded by an ordinary molding method and the releasing state of each molded articles was determined. The results obtained are shown in the following table together with the result by performing one dummy shot using the epoxy resin molding material in Comparison Example 1.

TABLE 1

| | Example | | | | | | | Comparison |
|---|---|---|---|---|---|---|---|---|
| | 1 | 2 | 3 | 4 | 5 | 6 | 7 | Example 1 |
| Components (parts by weight) | | | | | | | | |
| EPT | 100 | 100 | 100 | 100 | — | — | 100 | — |
| SBR | — | — | — | — | 100 | — | — | — |
| NBR | — | — | — | — | — | 100 | — | — |
| Silica powder | 20 | 20 | 20 | 20 | 20 | 20 | 20 | — |
| Titanium oxide | 5 | 5 | 5 | 5 | — | 5 | 5 | — |
| Aluminum hydroxide | — | — | — | — | 15 | — | — | — |
| Carnauba wax | 20 | 15 | 50 | — | 20 | 20 | 10 | — |
| Zinc stearate | — | — | — | 20 | — | — | 10 | — |
| Organic peroxide | 4 | 4 | 4 | 4 | 4 | 4 | 4 | — |
| MP-10 | — | — | — | — | — | — | — | 100 |
| Mold-releasing Property* | Good | Good | Good | Good | Good | Good | Good | Poor |

*Good: Released load about 2 kg/cm$^2$ or less
Poor: Release load about 20 kg/cm$^2$ or more As is clear from the above table, it can be seen that the mold-releasing sheets obtained in the Examples can impart good mold-releasing property to the cleaned molding surfaces of molds as compared to the case of the comparison example.

While the invention has been described in detail and with reference to specific embodiments thereof, it will be apparent to one skilled in the art that various changes and modifications can be made therein without departing from the spirit and scope thereof.

What is claimed is:

1. A method of applying a mold-releasing agent to molding surfaces of a mold after cleaning said molding surfaces comprising the steps of:
   (a) inserting a mold-releasing sheet between said molding surfaces, said mold-releasing sheet comprising a composition containing:
      (i) uncured rubber,
      (ii) a curing agent, and
      (iii) a mold releasing agent,
   (b) coating said molding surfaces with said mold releasing agent by heating and pressing said mold-releasing sheet to mold and cure said mold releasing sheet in said mold such that said mold-releasing agent oozes from said mold-releasing sheet and forms a uniform layer on said molding surfaces, and
   (c) removing the cured sheet from the molding surfaces of the mold, said uniform layer being sufficient to provide good mold-releasing property to said molding surfaces after said cleaning.

* * * * *